United States Patent [19]
Goser

[11] 3,975,718
[45] Aug. 17, 1976

[54] SEMICONDUCTOR ARRANGEMENT, PARTICULARLY A STORAGE ARRANGEMENT WITH FIELD EFFECT TRANSISTORS, AND METHOD OF OPERATING THE SAME

[75] Inventor: Karl Goser, Munich, Germany

[73] Assignee: Siemens Aktiengesellschaft, Berlin & Munich, Germany

[22] Filed: Sept. 25, 1974

[21] Appl. No.: 509,309

[30] Foreign Application Priority Data
Sept. 28, 1973 Germany............................ 2348984

[52] U.S. Cl................................ 340/173 R; 307/238; 307/279
[51] Int. Cl.² ........................................ G11C 11/40
[58] Field of Search.................. 340/173 R; 307/238

[56] References Cited
UNITED STATES PATENTS
3,753,248    8/1973    Lynes et al...................... 340/173 R Primary Examiner—Terrell W. Fears
Attorney, Agent, or Firm—Hill, Gross, Simpson, Van Santen, Steadman, Chiara & Simpson

[57] ABSTRACT

A storage arrangement employing first and second field effect transistors which are complementary to one another and connected in series, with the second transistor being of the depletion type, a load element, such as a resistor or transistor, being connected in series with such first mentioned transistors, with one side of such load element connected to the drain terminal of the first transistor and the other side of such load element connected to a line to which a supply voltage is connected, the drain-terminal of the second transistor being connected to a second line, which may form a word line, the gate terminal of the second transistor being connected to the drain terminal of the first transistor, and, preferably, a selector element such as a diode or transistor being operatively disposed between a third line and the junction of the load element and drain terminal of said first transistor, which third line may form a bit line, and a method of operating such arrangement.

32 Claims, 10 Drawing Figures

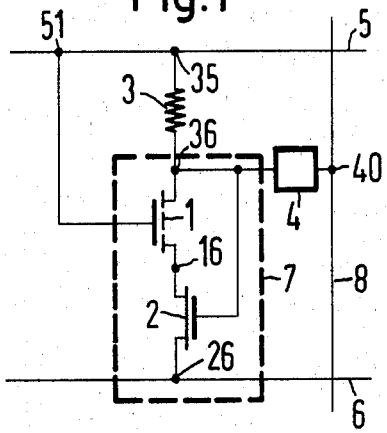
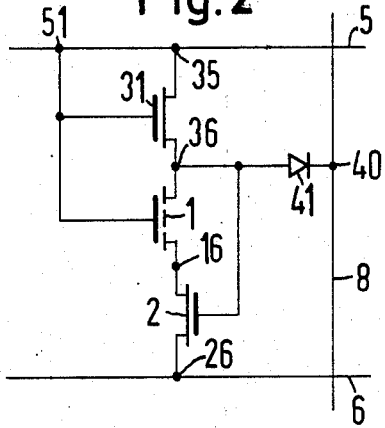
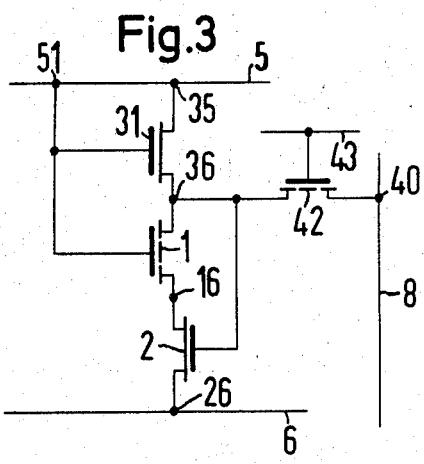
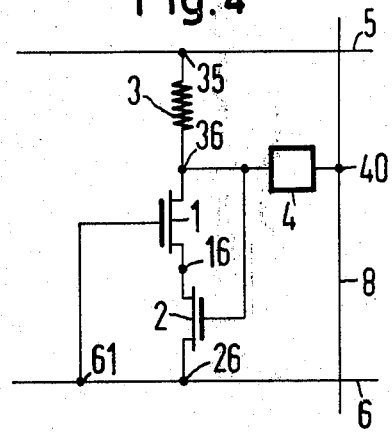

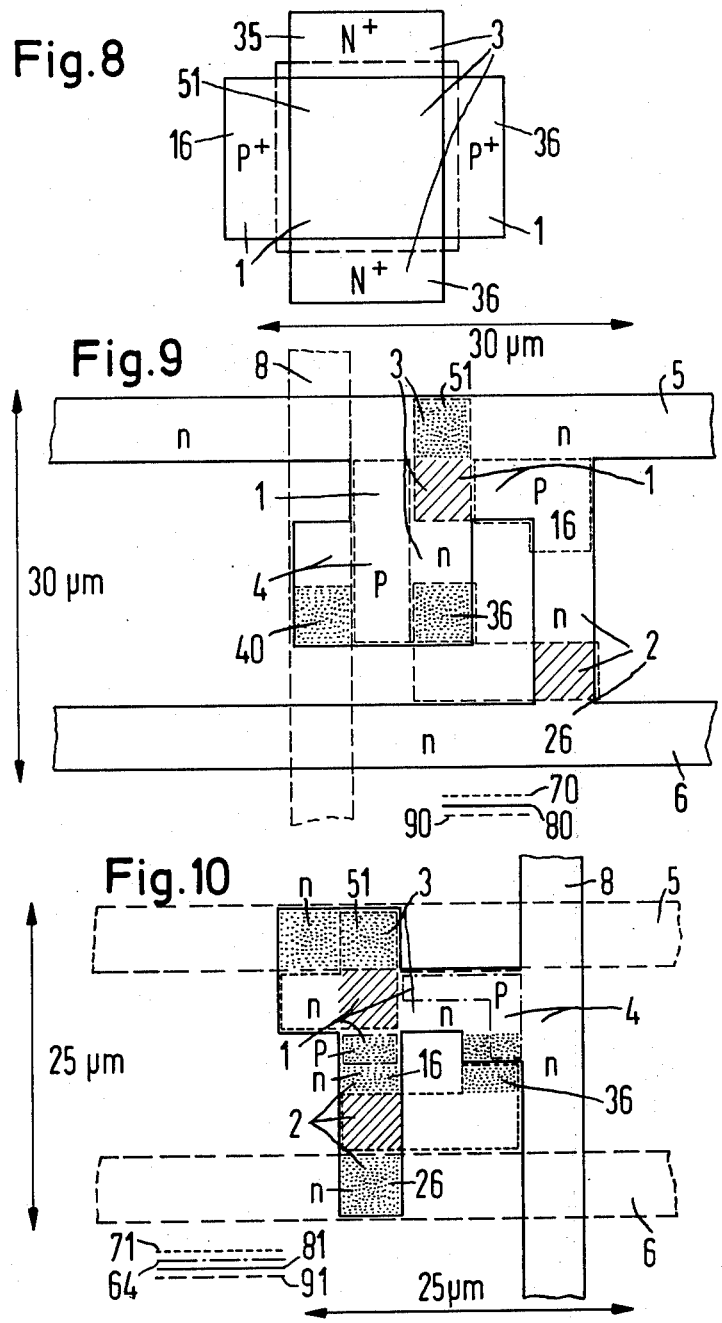

SEMICONDUCTOR ARRANGEMENT, PARTICULARLY A STORAGE ARRANGEMENT WITH FIELD EFFECT TRANSISTORS, AND METHOD OF OPERATING THE SAME

BACKGROUND OF THE INVENTION

The invention is directed to an arrangement having first and second field effect transistors, which are complementary to one another and connected in series, with the second transistor being of the depletion type.

An arrangement of this type is disclosed in an article entitled "A Distributed Gate Bistable MOS-Transistor" appearing in the publication "Solid State Electronics 14 (1971) pages 799–804. Such an arrangement employs a double transistor comprising two complementary transistors, the characteristic curve of which presents one portion in which the current drops while the voltage rises. In order to achieve this behavior, an enhancement p-channel-MOS transistor is connected in series with a depletion n-channel MOS transistor.

The invention has among its objects the provision of a static storage circuit including such type of arrangement.

SUMMARY OF THE INVENTION

The objective of the invention is achieved by the utilization of an arrangement in which the two complementary transistors are connected in series with a load element, such as a resistor or a transistor, one side of which load element is connected to the drain terminal of the first transistor and the other side of such element is connected to a line for supplying voltage thereto. The drain terminal of the second transistor is connected to a second line, which may form a word line, and the gate terminal of the latter transistor is connected to the drain terminal of the first transistor. In addition, a selector element, such as a diode or transistor, may be operatively disposed between a third line and the junction of the load element and drain terminal of the first transistor, which third line may form a bit line.

A particular fundamental advantage of an arrangement, in accordance with the invention, resides in the fact that, as a double-transistor is employed, merely a small area is required for a storage element formed thereby.

Advantageously, when the storage selection is derived by means of a transistor, an area of 1600 $\mu m^2$ can be achieved in an arrangement embodying the invention. If a diode is to be employed in such selection, an area of 900 $\mu m^2$ can be achieved. These figures are based on an arrangement utilizing an aluminum-gate technique with lines having widths of 5 $\mu m$. By the employment of a Si-gate technique, advantageously it is possible to even achieve an area of 625 $\mu m^2$. This area corresponds to that which a one-transistor storage element, of the same design specifications, would occupy.

A further advantage of a MOS arrangement, in accordance with the invention, resides in the fact that no regeneration circuits are required and space thus can be saved in the peripheral circuits.

A further advantage is that, as compared to dynamic storage elements, a time saving can be effected in the operation of the arrangement.

BRIEF DESCRIPTION OF THE DRAWINGS

In the drawings, wherein like reference characters indicate like or corresponding elements:

FIGS. 1 to 5 represent circuit diagrams of MOS-storage arrangements in accordance with the invention;

FIG. 8 schematically illustrates an arrangement of a double transistor embodying the invention;

FIG. 9 schematically illustrates the lay-out of a storage arrangement of the invention, employing an aluminum-gate technique; and FIG. 10 schematically illustrates the lay-out of a MOS storage arrangement of the invention in an Si-gate technique.

DETAILED DESCRIPTION OF THE INVENTION

Figure 5:
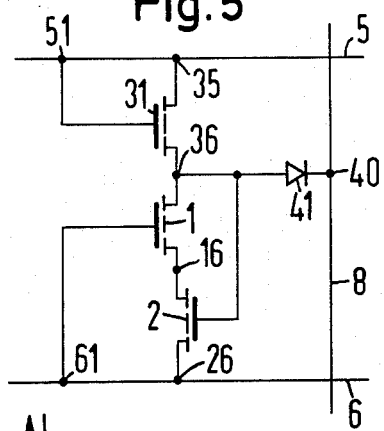

The following considerations led to the invention. Referring to FIG. 1, the known arrangement, described in the previously referred to publication, is enclosed in broken lines and identified by the reference numeral 7. When low voltages are applied between the points 36 and 26 of such known arrangement, the transistor 1 of which is of the enhancement type and has its gate connected to a fixed voltage, such transistor will be a relatively poor conductor. The transistor 2 is of the depletion type and thus is a relatively good conductor in comparison to the transistor 1, as the voltage on the transistor 1 is low in view of the low voltage applied between the points 36 and 26. consequently, the characteristic curve, identified by the reference numeral 12 in FIG. 6, will be formed. At low voltages such a curve initially will be governed by the characteristic curve of the transistor 1 and at higher voltages between the points 36 and 26, at which the transistor 1 is operating in the saturation range, the voltage drop on the transistor 1 is such that as a result thereof the transistor 2 is almost blocked and thus current passing through the arrangement virtually disappears. Consequently, at higher voltages the current again drops.

Figure 6:
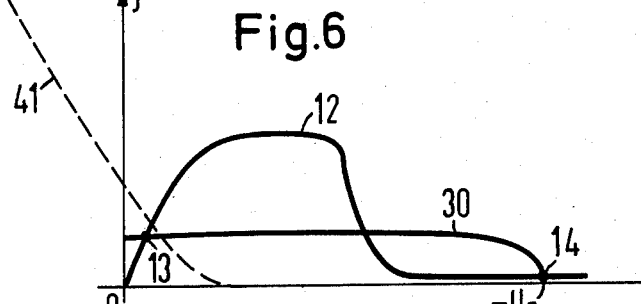
FIG. 6 illustrates the characteristic curves of a MOS-storage arrangement in accordance with the invention.

If now, in accordance with the invention, and as illustrated in FIG. 1, there is connected in series with the arrangement 7 a load element 3 (which can preferably comprise a resistor or a transistor), in the event the load element is a transistor, two stable operating points 13 and 14 are produced, as illustrated in FIG. 6. These points are intersection points between the characteristic curve 12 above described and the characteristic curve 30 of the load transistor, i.e. transistor 31. In the embodiment illustrated in FIG. 3, such load transistor 31 has its drain terminal connected to the point 36, i.e. to the drain terminal of the transistor 1, and the gate of the transistor 31 is connected to the gate of the transistor 1. The gate terminals of the transistors 31 and 1, and the source terminal of the transistor 31 thus are commonly operable over the line 5, while the drain terminal of the transistor 2 is operable over the line 6.

Preferably the load transistor 31 and the transistor 2 are n-channel MOS transistors of the depletion type and the transistor 1 is a p-channel MOS transistor of the enhancement type. The line 6 preferably is connected to ground and a supply voltage $U_5$ is connected to the line 5.

Preferably, particularly in the case of large storage matrices, one selector element 4 is provided for each MOS storage arrangement constructed in accordance with the invention. As illustrated in FIG. 2, a diode 41, for example, can serve as the selector element 4 of FIG. 1. In this arrangement one side of the selector diode 41 is connected to point 36 of the arrangement and the other side is connected to point 40 of a bit line 8. The use of a diode as a selector element has the advantage that the requirement with respect to necessary area is less.

As illustrated in FIG. 3, the selector element can also be in the form of a transistor 42, which in this case is operable over a line 43.

A bistable storage element, in accordance with the invention, can be achieved without the use of a selector element, in which case selection would be effected solely over the lines 5 and 6, whereby the line 5 may serve as a word line and the line 6 as a bit line.

Figure 7:
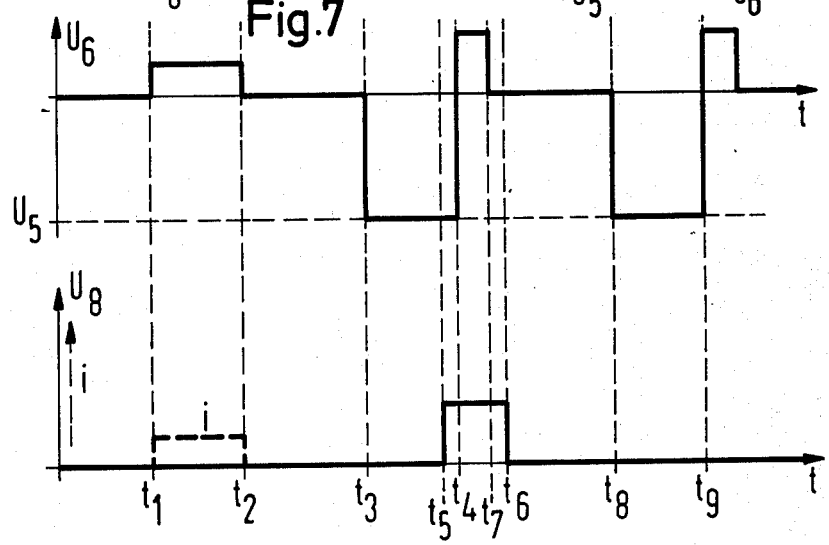
FIG. 7 represents a pulse diagram for the operation of a storage arrangement in accordance with the invention, illustrating the write-in and read-out operation therefor.

Referring to the pulse diagram illustrated in FIG. 7, the operation of a write-in of data into a storage element embodying the invention and the read-out of data from such an arrangement will be described in connection with a circuit, as illustrated in FIG. 2, employing a diode as a selector element. During read-out, the potential $U_6$ on the word line 6 is raised whereby a current flows across the diode when the arrangement is at the one stable point 13. If, on the other hand, the arrangement is at the other stable point 14, no current will flow across the diode 4, as the latter is blocked. In FIG. 7, the time of commencement of read-out is designated by the reference character $t_1$ and the end of the read-out period by the reference character $t_2$.

In effecting a write-in, initially the potential $U_6$ on the word line 6 is lowered to the supply potential $U_5$ which exists on the line 5, and which, in FIG. 7, corresponds to the time $t_3$. When the potential on the word line is subsequently raised (time $t_4$) the bistable element is brought to the one stable point 13. If at the same time the potential on the bit line 8 is raised (time $t_5$) the bistable storage circuit remains at the operating point 13. The pulse on the bit line 8 ($t_5$ to $t_6$) thus covers the pulse on the word line 6 ($t_4$ to $t_7$) so that the diode always remains blocked.

If the storage circuit, in accordance with the invention, is to be brought into the other stable point 14, the potential $U_6$ on the word line 6 is initially again lowered to the supply potential $U_5$ (time $t_8$). When the potential on the word line 6 is thereafter raised, at the time $t_9$, the bistable circuit is initially brought to the stable point 13, and in order to bring the storage circuit to the stable point 14, at the same time the potential $U_6$ on the word line is also subsequently raised, as in the case of read-out, but to a higher value so that a current of such magnitude flows across the diode 4 that the arrangement switches from point 13 to point 14. The potential $U_5$ must be greater than the starting voltages of the transistors, and advantageously the potential is selected two or three times such magnitude whereas the other potentials for read-out and write-in can be selected on the order of the start voltage.

With the present state of the art, the start voltages are normally between 0.3 V and 1.5 V. Advantageously, the power loss of a storage arrangement embodying the invention is low at the stable point 14 and determined practically only by the leakage currents in the transistors. At the stable point 13, the power loss is primarily due to the resistance of the load element which can be designed to be of relatively high resistance.

FIG. 4 illustrates a storage arrangement in which the gate terminal of the first transistor is connected to the line 6, as indicated at 61. In this arrangement the first transistor 1 and the second transistor 2 are of the depletion type and are disposed complementary to one another. Preferably, the first transistor 1 is an n-channel-MOS transistor and the second transistor 2 is a p-channel MOS transistor. If the voltage between the points 36 and 26 is lower than the sum of the start voltages of the transistors 1 and 2, both transistors will be conductive and the resistance between such points will therefore be relatively low at low voltages.

If, on the other hand, the voltage between the points 36 and 26 is greater than the sum of the start voltages of the transistors 1 and 2, the latter will be blocked, whereby the resistance between such points is very high.

If thus follows that for the circuit shown in FIG. 4, there will be a characteristic curve (curve 12 in FIG. 6) similar to that of the circuit illustrated in FIG. 1. Consequently, storage can be effected in the circuit illustrated in FIG. 4 in a manner similar to that of the circuit illustrated in FIG. 1.

Either a resistor or a transistor can be employed as the load element 3, FIG. 5 illustrating a storage arrangement in which the transistor 31 is used as a load element and the diode 41 as the selector element. In this case, the gate of the transistor 31, as previously described with respect to FIG. 3, is again connected at point 51 to the line 5.

It is also possible to employ a transistor as the selector element, in lieu of the diode 41, as previously mentioned with respect to the arrangement of FIG. 3.

Likewise, the storage arrangements of FIGS. 4 and 5 can be employed without a selector element, utilizing the lines 5 and 6 for selection.

It will be appreciated that an arragement in accordance with the invention advantageously can be constructed with MES field effect transistors, i.e. Metal-Semiconductor Field-Effect Transistors (MESFET).

Likewise, in accordance with a further development of the invention, the arrangement of the invention may be fabricated with the employment of junction field effect transistors.

Advantageously, the storage arrangement of the invention may be achieved utilizing the ESFI-MOS technique. ESFI is to be understood as a technique in which insular semiconductor layers, which are electrically insulated from one another, are grown epitaxially on an insulating substrate, with the individual components being arranged in such semiconductor layers, which preferably are composed of silicon. A substantial reduction in area can be achieved by combining the transistors 1 and 31 in a so-called double-transistor. German Patent application No. P 23 36 821.0 describes in detail a double-transistor of this type. FIG. 8 schematically illustrates the arrangement of such a transistor, in which the two transistors utilize the common gate 51. Details of FIG. 8 which have been heretofore described in connection with the other FIGURES are identified by corresponding reference characters.

FIG. 9 illustrates the design of a storage arrangement in accordance with the invention, such as illustrated in FIG. 2, in an aluminum-gate-technique on an insulating substrate (ESFI-MOS technique). This design employs an area of 900 $\mu m^2$, assuming that the width of and the spacing between adjacent conductor paths is, in each case, 5 $\mu m$. Details of FIG. 9 which have been previously described in connection with other FIGURES, likewise are provided with corresponding reference characters. In this case the continuous lines 80 represent the silicon layer, while the preferably n-conducting silicon layer contains p-zones which are indicated by dotted lines 70, and the aluminum conductor paths are represented by broken lines 90. The stipled areas 36, 40 and 51 comprise contact points between the aluminum conductor paths and the silicon layer.

The storage arrangement illustrated in FIG. 2 can be integrated on a surface area of approximately 625 $\mu m^2$ when an Si-gate technique is employed, FIG. 10 illustrating the lay-out of such a circuit. Details of FIG. 10 which have previously been explained in connection with other FIGURES, likewise are designated by corresponding reference characters. The continuous lines 81 define the silicon layer, which preferably is n-doped, while the dash-dotted lines 64 represent the p-doped zones provided in such layer. The silicon gate layers of the transistors are designated by dotted lines 71, while the aluminum conductor paths are designated by broken lines 91. The stipled areas 16, 26, 36 and 51 represent the contact points between the aluminum conductor paths and the silicon layer. Assuming identical design specifications, the area occupied by the arrangement illustrated in FIG. 10 is approximately equal to the area occupied by a one-transistor storage element employing the Si-gate technique. However, in contrast to the storage arrangement of the invention, such a one-transistor storage element is a dynamic storage element additionally requiring regeneration stages, whereas a storage arrangement embodying the invention is a static storage element which advantageously requires no additional regeneration stages.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. In a storage arrangement the combination of first and second field effect transistors, which are complementary to one another and connected to series, with the second transistor being of the depletion type, a load element connected in series with such transistors with one side of such load element connected to the drain terminal of the first transistor, and the other side of such load element connected to a line to which a supply voltage is connected, the drain terminal of the second transistor being connected to a second line, and the gate terminal of the second transistor being connected to the drain terminal of the first transistor.

2. An arrangment according to claim 1 wherein the first line is a word line and the second line is a bit line, by means of which the storage state of the arrangement may be determined.

3. An arrangement according to claim 1, comprising in further combination, a third line forming a bit line, and a selector element disposed between said bit line and the junction of the load element and drain terminal of said first transistor.

4. An arrangement according to claim 1, wherein the first transistor is of the enhancement type and the gate terminal thereof is connected to said first line.

5. An arrangement according to claim 1, wherein the first transistor is of the depletion type and the gate terminal thereof is connected to the second line.

6. An arrangement according to claim 1, wherein said load element is a resistor.

7. An arrangement according to claim 1, wherein the load element is a transistor of the depletion type, the gate terminal of which is connected to the first line.

8. An arrangement according to claim 3, wherein said selector element is a diode.

9. An arrangement according to claim 8, wherein the first transistor is of the enhancement type and the gate terminal thereof is connected to said first line.

10. An arrangement according to claim 8, wherein the first transistor is of the depletion type and the gate terminal thereof is connected to the second line.

11. An arrangement according to claim 8, wherein the first transistor and the load transistor are integrated in a double transistors, with such transistors being complementary to one another.

12. An arrangement according to claim 8, wherein the arrangement is constructed with MES field effect transistors.

13. An arrangement according to claim 8, wherein the arrangement is constructed with junction field effect transistors.

14. An arrangement according to claim 8, wherein the arrangement is constructed in the form of an epitaxial silicon layer deposited on an insulating substrate of spinel or sapphire.

15. An arrangement according to claim 8, wherein the arrangement is of an aluminium-gate-technique construction.

16. An arrangement according to claim 8, wherein the arrangement is of Si-gate technique construction.

17. An arrangement according to claim 3, wherein said selector element is a transistor which is operable over its gate terminal.

18. An arrangement according to claim 17, wherein the first transistor is of the enhancement type and the gate terminal thereof is connected to said first line.

19. An arrangement according to claim 17, wherein the first transistor is of the depletion type and the gate terminal thereof is connected to the second line.

20. An arrangement according to claim 17, wherein the first transistor and the load transistor are integrated in a double transistor, with such transistors being complementary to one another.

21. An arrangement according to claim 17, wherein the arrangement is constructed with MES field effect transistors.

22. An arrangement according to claim 17, wherein the arrangement is constructed with junction field effect transistors.

23. An arrangement according to claim 17, wherein the arrangement is constructed in the form of an epitaxial silicon layer deposited on an insulating substrate of spinel or sapphire.

24. An arrangement according to claim 17, wherein the arrangement is of an aluminum-gate-technique construction.

25. An arrangement according to claim 17, wherein the arrangement is of Si-gate technique construction.

26. An arrangement according to claim 1, wherein the first transistor and the load transistor are integrated in a double transistor, in which both transistors are complementary to one another.

27. An arrangement according to claim 1, wherein the arrangement is constructed with MES field effect transistors.

28. An arrangement according to claim 1, wherein the arrangement is constructed with junction field effect transistors.

29. An arrangement according to claim 1, wherein the arrangement is constructed in the form of an epitaxial silicon layer deposited on an insulating substrate of spinel or sapphire.

30. An arrangement according to claim 1, wherein the arrangement is of an aluminum-gate-technique construction.

31. An arrangement according to claim 1, wherein the arrangement is of Si-gate technique construction.

32. A method for the operation of a semiconductor arrangement, having two stable operating points, comprising complementary first and second field effect transistors, connected in series with a load element, the second transistor being of the depletion type, with a load element connecting the drain terminal of the first transistor with a voltage supply line and a diode connecting the junction of said drain terminal and load element to a bit line, the drain terminal of the second transistor being connected to a second line comprising a word line, and the gate terminal of the second transistor being connected to the drain terminal of the first transistor, comprising the steps, for read-out of data, of so raising the potential on the word line that a current flows across the diode when the arrangement is in one stable point and no current flows across the diode when the arrangement is in the other stable point, and for the write-in of data, lowering the potential on the word line to the potential prevailing on said voltage supply line and, in order to bring the arrangement into the one stable point, simultaneously raising the potential on the word line and on the bit line, with the pulse on the bit line covering the pulse on the word line, and, in order to bring the arrangement into the other stable point, raising the potential on the word line, whereby the arrangement is initially brought onto the first stable point and by so varying the potential on the word line that a current of such magnitude flows through the diode that the arrangement switches into the other stable point.

* * * * *